US007932002B2

(12) United States Patent
Takai (10) Patent No.: US 7,932,002 B2
(45) Date of Patent: Apr. 26, 2011

(54) REFLECTION-TYPE MASK AND METHOD OF MAKING THE REFLECTION-TYPE MASK

(75) Inventor: Kosuke Takai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 142 days.

(21) Appl. No.: 12/397,003

(22) Filed: Mar. 3, 2009

(65) Prior Publication Data

US 2009/0220869 A1 Sep. 3, 2009

(30) Foreign Application Priority Data

Mar. 3, 2008 (JP) .................................. 2008-052198

(51) Int. Cl.
*G03F 1/00* (2006.01)
(52) U.S. Cl. ........................................................... 430/5
(58) Field of Classification Search .............. 430/5, 394; 378/35
See application file for complete search history.

(56) References Cited

U.S. PATENT DOCUMENTS

| 5,549,994 A | 8/1996 | Watanabe et al. | |
|---|---|---|---|
| 2006/0222961 A1 * | 10/2006 | Yan | 430/5 |

FOREIGN PATENT DOCUMENTS

| JP | 2-14511 | 1/1990 |
|---|---|---|
| JP | 2004-207593 | 7/2004 |
| JP | 2006-228766 | 8/2006 |
| JP | 2007-206563 | 8/2007 |

OTHER PUBLICATIONS

Notification of Reasons for Rejection issued by the Japanese Patent Office on May 28, 2010, for Japanese Patent Application No. 2008-052198, and English-language translation thereof.

* cited by examiner

*Primary Examiner* — Stephen Rosasco
(74) *Attorney, Agent, or Firm* — Finnegan, Henderson, Farabow, Garrett & Dunner, L.L.P.

(57) ABSTRACT

To provide a reflection-type mask having a reduced shadowing effect, capable of phase shift exposure and having a shading frame of sufficient shading performance. The mask includes a substrate 11, a multilayer reflective film 12 which is formed above the substrate 11, and which reflects exposure light, a first photoabsorber layer 15 which is formed above the multilayer reflective film 12, and which absorbs the exposure light, a circuit pattern region 16 constituted, in conformity with a predetermined circuit pattern, of an opening formed as a result of removal of the first photoabsorber layer 15 and an absorbing portion where the first photoabsorber layer remains, and a shading region 18 having a reflectance with respect to the exposure light lower than that in the absorbing portion of the circuit pattern region 16.

18 Claims, 11 Drawing Sheets

REFLECTION-TYPE MASK AND METHOD OF MAKING THE REFLECTION-TYPE MASK

CROSS REFERENCE TO RELATED APPLICATION

This application is based upon and claims the benefit of priority from the prior Japanese Patent Application No. 2008-052198, filed on Mar. 3, 2008, the entire contents of which are incorporated herein by reference.

BACKGROUND OF THE INVENTION

1. Field of the Invention

The present invention relates to a reflection-type mask, e.g., one used in extreme ultraviolet (EUV) lithography and to a method of making the reflection-type mask.

2. Background Art

In recent years, EUV lithography using extreme ultraviolet having a wavelength in the vicinity of 13.5 nm as exposure light has been proposed to realize transfer of finer patterns.

In EUV lithography, a reflection-type mask is used for reasons including small differences in absorptivity between materials to EUV light. A reflection-type mask used in EUV lithography is made on the basis of a substrate called a mask blank.

The mask blank has a mutlilayer reflective film, a buffer layer and a photoabsorber layer successively formed on a Low Thermal Expansion (LTE) grass substrate. A desired circuit pattern is formed by etching the photoabsorber layer and the buffer layer. EUV light is absorbed in a portion formed of a photoabsorber and is reflected by the multilayer reflective film in a portion formed as a result of removal of the photoabsorber. In this way, EUV light is reflected as an image of the desired circuit pattern.

A phase shifting method may be used with a reflection-type mask as well as with a transmission-type mask to further improve the resolution. For example, as such a reflection-type mask, one disclosed in Japanese Patent Laid-Open No. 2004-207593 exists. According to this publication, a mask which can have both the desired reflectance and the desired phase difference and which is capable of attenuated phase shift exposure is obtained by optimizing each of a ruthenium (Ru) layer and a tantalum (Ta) layer constituting a pattern 1 (two-layer film) formed on a multilayer film 2.

However, there is a problem that if the film thickness of the pattern formed on the mask is increased, the influence of the shadowing effect is increased.

The shadowing effect is known as a problem with lithography using a reflection-type mask. The shadowing effect is a phenomenon in which a reflected pattern image is deformed due to the height of patterned photoabsorber layer. That is, the shadow of the photoabsorber layer is cast because exposure light is incident at a certain angle (ordinarily about 6°) from a plane perpendicular to the mask blank. In the shadowed region, the reflectance with respect to the exposure light is reduced, resulting in a variation in size of the reflected pattern image.

It is possible to reduce the influence of the shadowing effect by reducing the film thickness of the photoabsorber layer. However, if the photoabsorber layer is reduced, the absorbed exposure light intensity is reduced. Therefore, the exposure light intensity transmitted through the photoabsorber layer and radiated out of the mask after being reflected by the multilayer reflective film is increased. A problem then newly arises which relates to the shading performance of a region with which shading is to be performed, e.g., a shading frame. The shading frame is a frame provided so as to surround a circuit pattern region of the mask for the purpose of preventing exposure light from leaking to a region adjacent to a pattern transfer target block on a wafer. An increased reflection light intensity from the shading frame influences the adjacent region and causes a reduction in yield. It is, therefore, desirable that the reflectance of the shading frame be sufficiently low.

There is a problem that if the film thickness of the photoabsorber layer is reduced in order to reduce the above-described shadowing effect, the intensity of light radiated from the photoabsorber layer to the outside of the mask is increased and a failure to ensure the desired shading performance of the shading frame results.

SUMMARY OF THE INVENTION

According to one aspect of the present invention, there is provided a reflection-type mask including a substrate, a multilayer reflective film which is formed above the substrate, and which reflects exposure light, a first photoabsorber layer which is formed above the multilayer reflective film, and which absorbs the exposure light, a circuit pattern region constituted, in conformity with a predetermined circuit pattern, of an opening formed as a result of removal of the first photoabsorber layer, and an absorbing portion where the first photoabsorber layer remains, and a shading region having a reflectance with respect to the exposure light lower than that in the absorbing portion of the circuit pattern region.

According to another aspect of the present invention, there is provided a method of manufacturing a reflection-type mask, including preparing a substrate, forming a multilayer reflective film above the substrate, forming a first photoabsorber layer above the multilayer reflective film, forming a circuit pattern region constituted of an opening formed as a result of removal of the first photoabsorber layer, and an absorbing portion where the first photoabsorber layer remains, by etching the first photoabsorber layer in conformity with a predetermined circuit pattern, and forming a shading region having a reflectance with respect to the exposure light lower than that in the absorbing portion of the circuit pattern region.

DESCRIPTION OF THE EMBODIMENTS

First to sixth embodiments of the present invention will be described with reference to the accompanying drawings. All of the embodiments have a commonality in reducing the thickness of a photoabsorber layer for the purpose of reducing the above-described shadowing effect while enabling attenuated phase shift exposure but use different techniques to reduce the reflectance of a shading frame (shading region).

In the first and second embodiments, the reflectance of a shading frame is reduced by etching a multilayer reflective film in a portion in which the shading frame is to be formed. In the third to fifth embodiments, the reflectance of a shading frame is reduced by providing an absorber layer or a shading layer in a portion in which a shading frame is to be formed. In the sixth embodiment, the reflectance of a multilayer reflective film in a portion in which a shading frame is to be formed is reduced by implanting the portion with ions or irradiating the portion with femtosecond laser pulse light.

Constituent members having the same functions are indicated by the same reference numerals and, in principle, the same description for them will not be repeated.

First Embodiment

Figure 1:
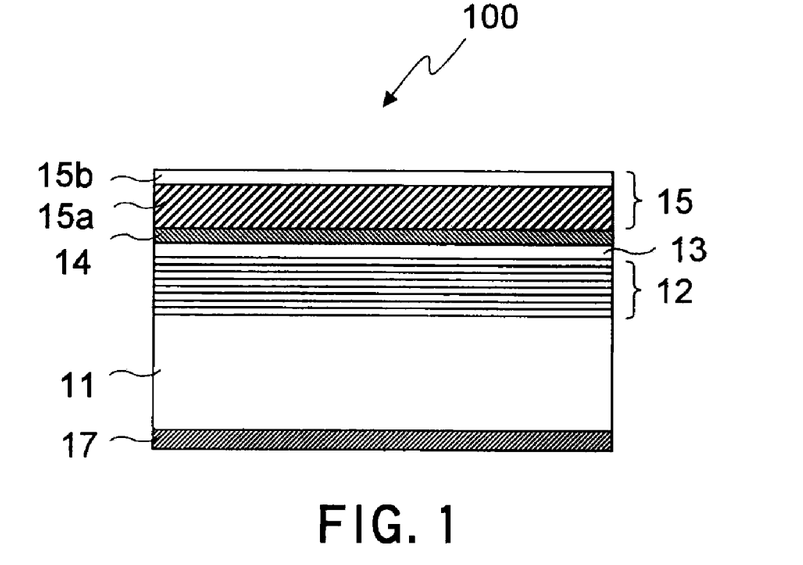
FIG. 1 is a sectional view of a mask blank used in a reflection-type mask.

A method of making a mask blank used in making of a reflection-type mask according to the first embodiment of the present invention and components will be described. FIG. 1 is a sectional view of a mask blank 100.

As can be understood from FIG. 1, the mask blank 100 is made by successively forming a multilayer reflective film 12, a capping layer 13, a buffer layer 14 and a photoabsorber layer 15 on a glass substrate 11 and thereafter forming a back conductive film 17 on a back surface of the glass substrate 11. Each constituent member will be described below.

The glass substrate 11 is a glass substrate having an extremely low thermal expansion coefficient (a low thermal expansion material (LTEM)).

The multilayer reflective film 12 is a stack of a pair of thin films formed of molybdenum (Mo) thin film and silicon (Si) thin film in 40 to 50 pairs. This pair of films is formed by sputtering. The multilayer reflective film 12 reflects EUV light, which is exposure light. The electroconductive molybdenum film may be grounded to prevent the mask from being charged up to deform the reflection pattern image at the time of irradiation with EUV light.

The capping layer 13 is an uppermost silicon (Si) layer deposited substantially thick, with which the multilayer reflective film 12 is protected. As a material for the capping layer 13, ruthenium (Ru) or titanium oxide (TiO) may be used. If ruthenium is used, the buffer layer 14 described below is not necessary.

The buffer layer 14 is formed of a film of chromium (Cr). The buffer layer 14 functions as an etching stop layer when the photoabsorber layer 15 described below is etched to form a circuit pattern.

The photoabsorber layer 15 has an absorber 15a that serves as an absorbing layer to EUV light and an antireflection film 15b which is formed on the absorber 15a and which functions as an antireflection layer (AR layer) with respect to inspection light in the vicinity of a wavelength of 250 nm.

The absorber 15a is formed of a film of tantalum nitride (TaN). A material containing tantalum (e.g., tantalum boron nitride (TaBN)) or a material containing chromium (e.g., chromium nitride (CrN)) may alternatively be used.

The antireflection film 15b is formed of a film of tantalum oxide (TaO). A material containing tantalum (e.g., tantalum boron oxide (TaBO)) or a material containing chromium (e.g., chromium oxide ($CrO_x$)) may alternatively be used.

If a material containing chromium is used in the photoabsorber layer 15, a material capable of functioning as an etching stop layer other than chromium is used in the buffer layer 14.

The photoabsorber layer 15 is etched in conformity with a desired circuit pattern by a plasma process described below and is constituted of a portion (an opening) formed as a result of removal of the photoabsorber layer 15 and a portion (an absorbing portion) where the photoabsorber layer 15 remains. To enable attenuated phase shift exposure, the material and the film thickness of the photoabsorber layer 15 are determined so that a reflectance of 1 to 20% with respect to incident EUV light is obtained in the absorbing portion, and that the phase difference between light radiated from the absorbing portion to the outside (the upper side as viewed in FIG. 1) of the mask and light radiated to the outside through the opening is 175° to 185° (preferably 180°). In a case where tantalum nitride is used for the absorber 15a and tantalum oxide is used for the antireflection film 15b, the thickness of the photoabsorber layer 15 is about 50 nm.

While the film thickness of the photoabsorber layer is about 100 nm in the reflection-type phase shift mask according to the related art, the shadowing effect can be reduced by reducing the film thickness of the photoabsorber layer in the present embodiment relative to that in the conventional mask.

The back conductive film 17 is formed of a film of chromium nitride (CrN) for enabling electrostatic chucking at the time of EUV exposure.

A procedure of making the mask blank 100 shown in FIG. 1 and making a reflection-type mask 200 according to the present embodiment shown in FIG. 3C will next be described. The making process is roughly divided into two processes, one of which is a circuit pattern forming process shown in FIGS. 2A to 2C, and the other of which is a shading frame forming process shown in FIGS. 3A to 3C.

Figure 2A:
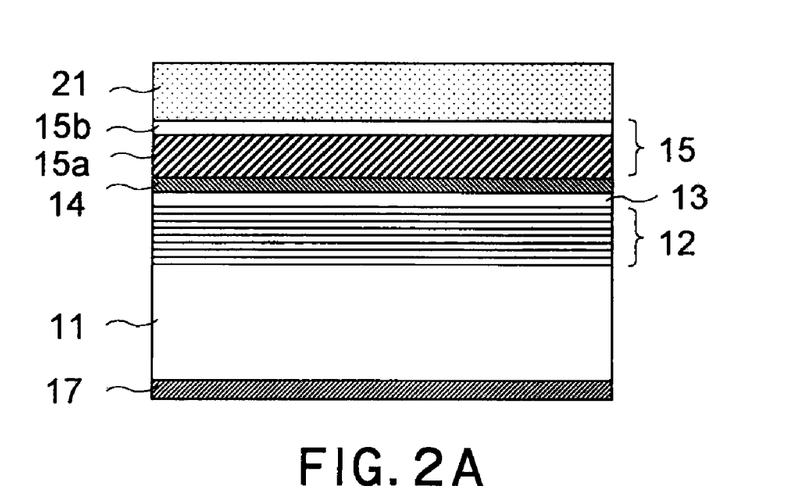
FIG. 2A is a sectional view showing a process of making a circuit pattern of a reflection-type mask according to a first embodiment of the present invention.
Figure 2B:
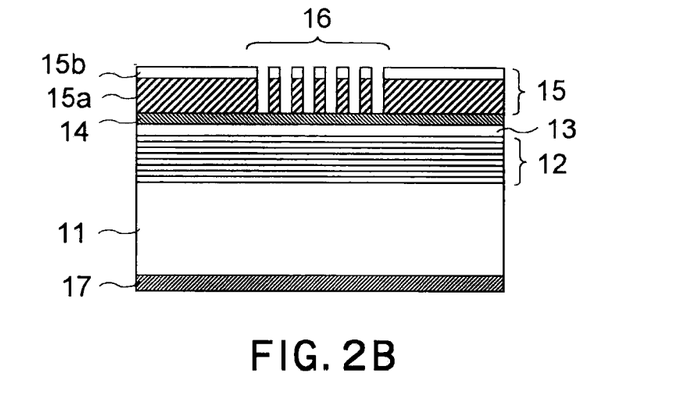
FIG. 2B is a sectional view following FIG. 2A, showing the process of making the circuit pattern of the reflection-type mask according to the first embodiment.
Figure 2C:
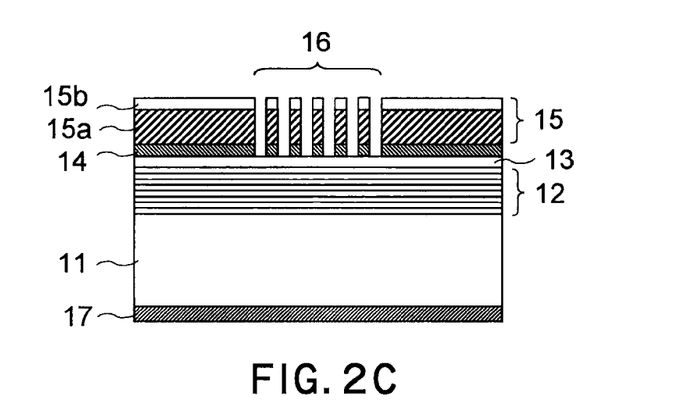
FIG. 2C is a sectional view following FIG. 2B, showing the process of making the circuit pattern of the reflection-type mask according to the first embodiment.

(1) First, as shown in FIG. 2A, an EB resist 21 is applied on the photoabsorber layer 15. A desired circuit pattern is thereafter drawn with an electron beam by using an electron beam drawing device.
(2) Next, a post exposure bake (PEB) step and a development step are performed to form a resist pattern.
(3) Next, as shown in FIG. 2B, the photoabsorber layer 15 is etched by a plasma process and the EB resist 21 is thereafter removed.
(4) Next, a defect inspection step and a correction step are performed, thereby detecting and removing defects on the pattern.
(5) Next, as shown in FIG. 2C, the buffer layer 14 positioned at openings of a circuit pattern region 16 is etched to expose portions of the capping layer 13. If the buffer layer 14 is formed of chromium, a mixture gas of chlorine ($Cl_2$) and oxygen ($O_2$) is used as dry etching gas.

By the above-described process, the circuit pattern region 16 is completed. The circuit pattern region 16 is constituted of openings formed by removing the photoabsorber layer 15 and the buffer layer 14 and absorbing portions in which the photoabsorber layer 15 and the buffer layer 14 remain according to a desired circuit pattern.

Figure 3A:
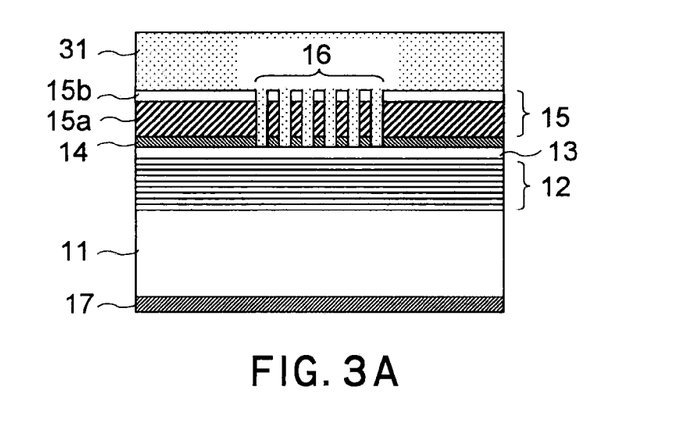
FIG. 3A is a sectional view showing a process of making a shading frame of the reflection-type mask according to the first embodiment.
Figure 3B:
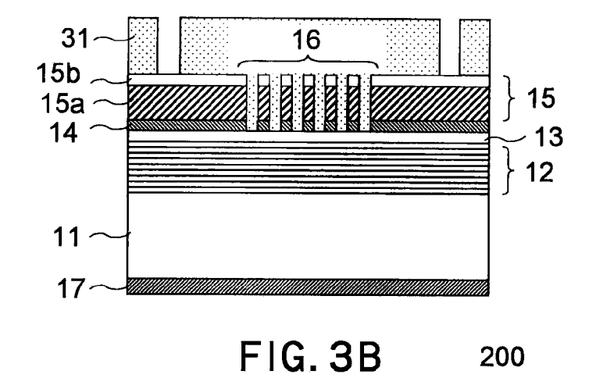
FIG. 3B is a sectional view following FIG. 3A, showing the process of making the shading frame of the reflection-type mask according to the first embodiment.

(6) Next, as shown in FIG. 3A, a photoresist 31 is applied on the photoabsorber layer 15 and the exposed capping layer 13. Patterning of the photoresist 31 with laser light or the like is thereafter performed. In the portion on which this patterning is performed, a shading frame is to be formed.
(7) Next, as shown in FIG. 3B, a resist development step is performed to expose the photoabsorber layer 15 in the portion in which the shading frame is to be formed.
(8) Next, as shown in FIG. 3C, a plasma etching step for etching on the photoabsorber layer 15, the buffer layer 14, the capping layer 13 and the multilayer reflective film 12 is performed.

The plasma etching step will be described in more detail.
(8-1) First, the photoabsorber layer 15 is removed by performing plasma etching using fluoric and chloric gases.
(8-2) Next, the buffer layer 14 is removed by performing plasma etching using a mixture gas of chlorine and oxygen.
(8-3) Next, the Mo/Si stacked thin film constituting the multilayer reflective film 12 is etched by plasma etching using a fluoric or chloric gas.

Figure 3C:
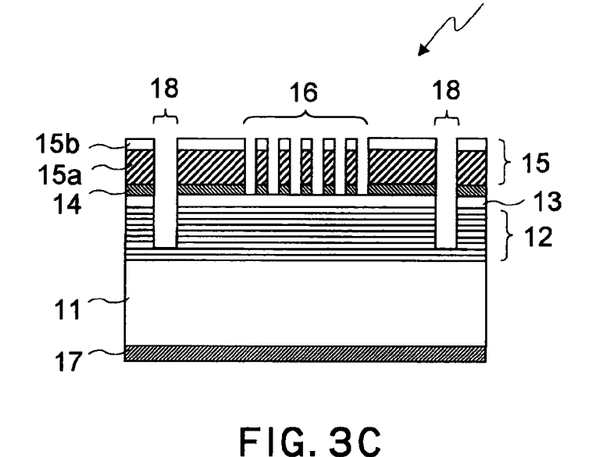
FIG. 3C is a sectional view of the reflection-type mask according to the first embodiment.

FIG. 3C shows a section of the reflection-type mask 200 obtained by removing the photoresist 31 after forming a shading frame 18 by the plasma etching step. Marks or the like including alignment marks used for positioning of the mask, a pattern for accuracy check and a mask ID, not shown in this figure, are provided in a peripheral portion outside the shading frame 18.

In the above-described plasma etching step, the multilayer reflective film 12 may be fully etched so that the bottom of the shading frame 18 reaches the glass substrate 11. However, as shown in FIG. 3C, fully etching the multilayer reflective film 12 is not necessarily required. That is, it is sufficient to perform etching until the film thickness is reduced, for example, to 0.1% or less so that the reflectance in the shading frame with respect to applied EUV light is lower than the reflectance in the absorbing portions in the circuit pattern region.

Also, the desired electrical conductivity in the mask face can be secured by leaving a portion of the multilayer reflective film 12 (including electroconductive molybdenum thin film). Prevention of charge-up in the exposed region at the time of exposure can be achieved by grounding the remaining molybdenum thin film, thus obtaining advantages including capability of obtaining a distortion-free reflection pattern image.

In the present embodiment, as described above, at least part of the multilayer reflective film 12 in a portion in which a shading frame is to be formed is etched to form the shading frame 18 having a sufficient shading performance without increasing the thickness of the photoabsorber layer 15.

Also, since there is no need to increase the thickness of the photoabsorber layer 15 in the circuit pattern region 16 for the purpose of securing the desired shading performance, the shadowing effect can be reduced. Further, a reflection-type mask capable of attenuated phase shift exposure can be obtained by setting the thickness of the photoabsorber layer 15 to a suitable value according to the material.

Second Embodiment

Figure 4:
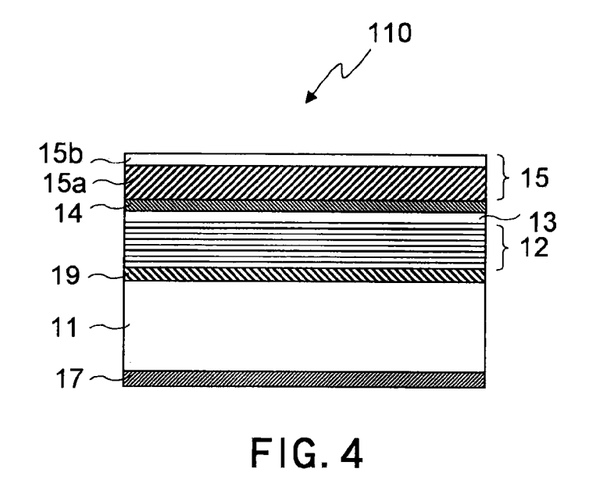
FIG. 4 is a sectional view of a mask blank used in a reflection-type mask.

The second embodiment of the present invention will be described. In the second embodiment, a mask blank 110 shown in FIG. 4 is used. This mask blank 110 differs from the mask blank 100 described above in the description of the first embodiment in that an electroconductive layer 19 is formed between the glass substrate 11 and the multilayer reflective film 12. The electroconductive layer 19 is a metal film having tantalum (Ta) or chromium (Cr).

Figure 5A:
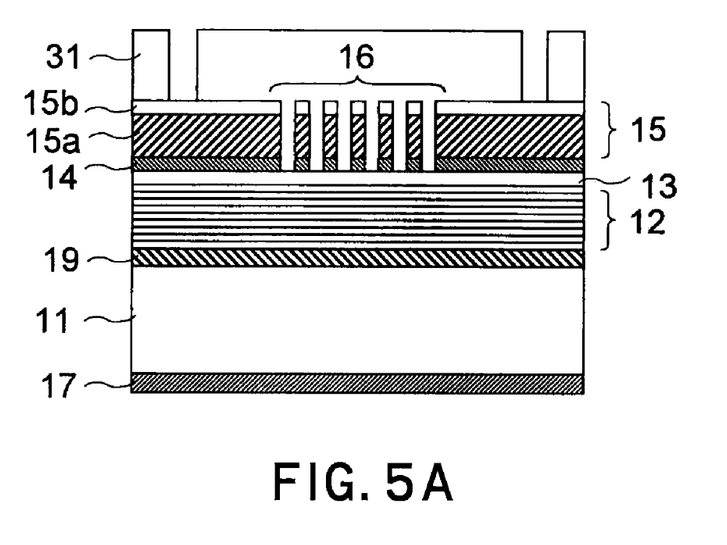
FIG. 5A is a sectional view showing a process of making a circuit pattern of a reflection-type mask according to a second embodiment of the present invention.

A method of making a reflection-type mask 210 according to the present embodiment will be described.
(1) The process described above in the description of the first embodiment is performed on the mask blank 110 to obtain a reflection-type mask at an intermediate making stage shown in FIG. 5A.
(2) Next, a plasma etching process for etching on the photoabsorber layer 15, the buffer layer 14, the capping layer 13 and the multilayer reflective film 12 is performed, as described above with respect to the first embodiment. However, as can be understood from FIG. 5B, the multilayer reflective film 12 is removed by being fully etched in the thickness direction at the time of etching on the multilayer reflective film 12.

Figure 5B:
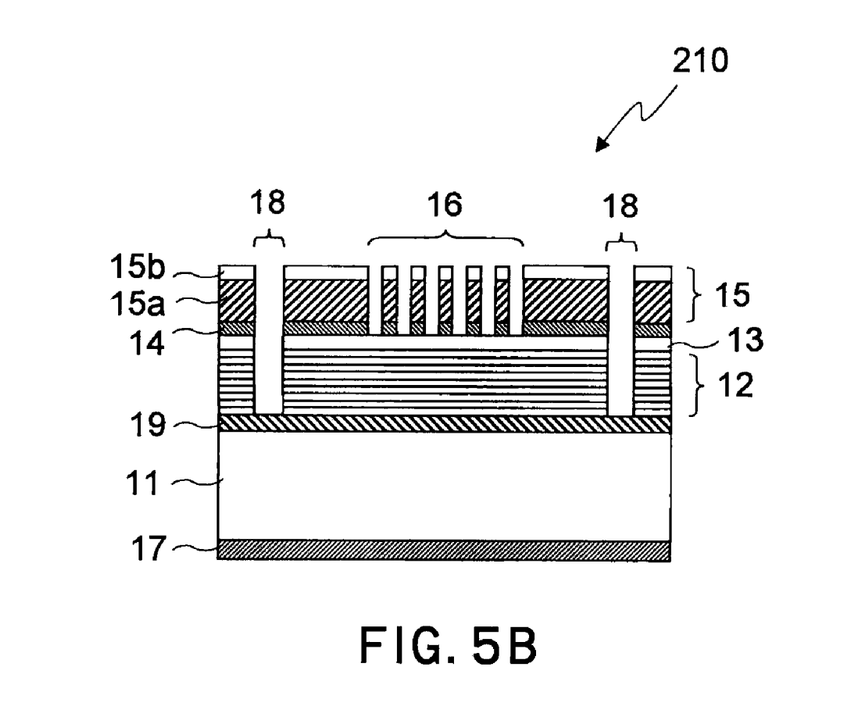
FIG. 5B is a sectional view of the reflection-type mask according to the second embodiment.

The reflection-type mask 210 according to the present embodiment is obtained by the above-described method. FIG. 5B shows a section of the reflection-type mask 210. The multilayer reflective film 12 in the shading frame 18 is entirely removed. However, since the electroconductive layer 19 exists, the desired electrical conductivity in the mask face is secured. Prevention of charge-up in the exposure region at the time of exposure is thereby enabled. As a result, a distortion-free reflection pattern image can be obtained.

Since the multilayer reflective film 12 is fully removed as seen in FIG. 5B, the reflectance in the shading frame 18 can be minimized.

In the present embodiment, as described above, the multilayer reflective film 12 in the portion in which a shading frame is to be formed is fully etched in the thickness direction to enable forming of the shading frame 18 having sufficient shading performance without increasing the thickness of the photoabsorber layer 15.

Also, since there is no need to increase the thickness of the photoabsorber layer 15 in the circuit pattern region 16 for the purpose of securing the desired shading performance, the shadowing effect can be reduced. Further, a reflection-type mask capable of attenuated phase shift exposure can be obtained by setting the thickness of the photoabsorber layer 15 to a suitable value according to the material.

Further, since there is no need to stop etching the multilayer reflective film 12 halfway at the time of etching on the multilayer reflective film 12, the controllability of the process can be improved.

Third Embodiment

Figure 6:
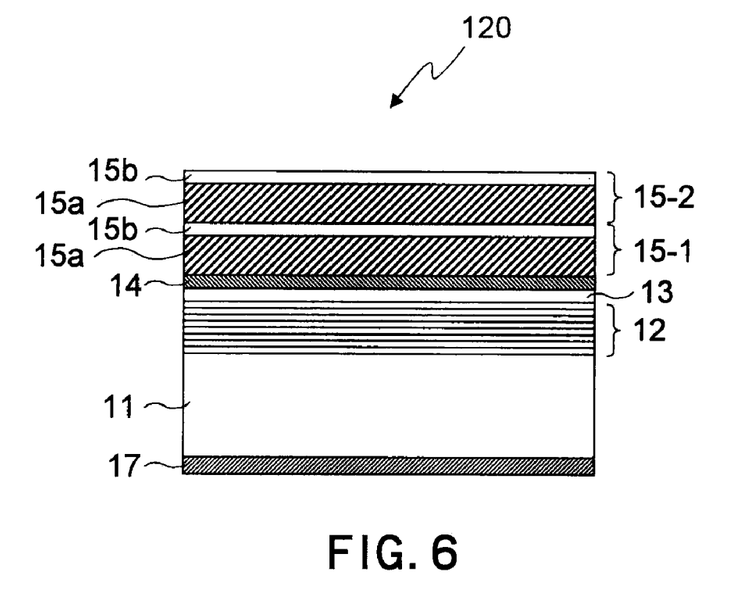
FIG. 6 is a sectional view of a mask blank used in a reflection-type mask.

The third embodiment of the present invention will be described. In the third embodiment, a mask blank 120 shown in FIG. 6 is used. This mask blank 120 differs from the mask blank 100 described above in the description of the first embodiment in that, as can be understood from FIG. 6, a second photoabsorber layer 15-2 is formed on a first photoabsorber layer 15-1 corresponding to the photoabsorber layer 15 described above in the description of the first embodiment.

Each of the first photoabsorber layer 15-1 and the second photoabsorber layer 15-2 has an absorber 15a and an antireflection film 15b formed on the absorber 15a. A material containing tantalum (e.g., TaN, TaBN or TaBO) is used as the material of the photoabsorber layer.

The material and the film thickness of the first photoabsorber layer 15-1 are determined to enable attenuated phase shift exposure, as in the case of the photoabsorber layer 15 described in the description of the first embodiment.

A procedure of making a reflection-type mask 220 according to the present embodiment shown in FIG. 7E from the above-described mask blank 120 will be described.

Figure 7A:
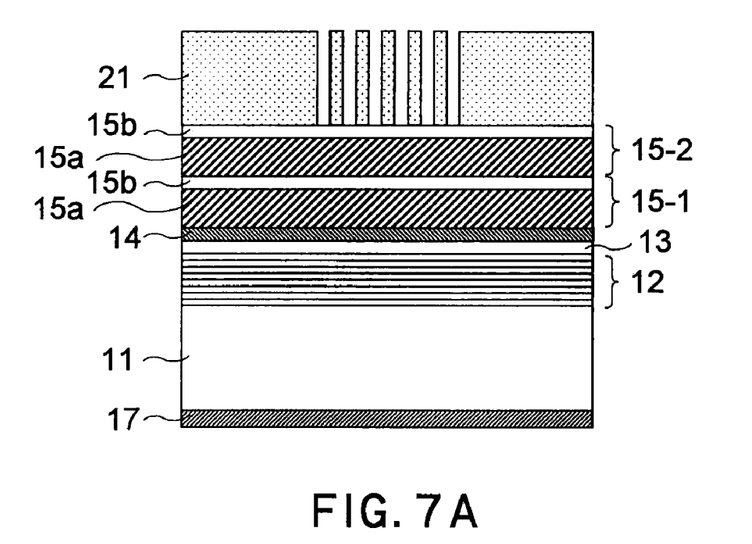
FIG. 7A is a sectional view showing a process of making a reflection-type mask according to a third embodiment of the present invention.

(1) First, EB resist 21 is applied on the second photoabsorber layer 15-2. A desired circuit pattern is thereafter drawn with an electron beam by using an electron beam drawing device.

(2) Next, a PEB step and a development step are performed to form a resist pattern, as shown in FIG. 7A.

Figure 7B:
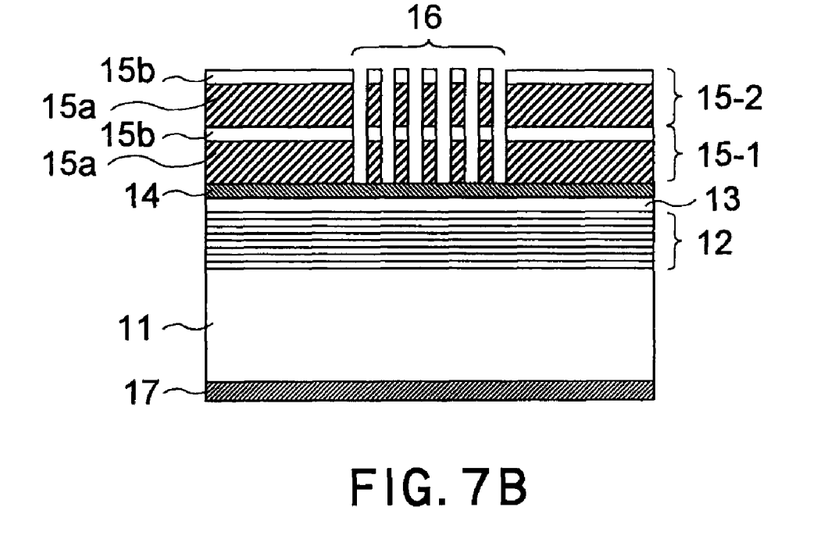
FIG. 7B is a sectional view following FIG. 7A, showing the process of making the reflection-type mask according to the third embodiment of the present invention.

(3) Next, as shown in FIG. 7B, the first photoabsorber layer 15-1 and the second photoabsorber layer 15-2 are etched by a plasma process to expose portions of the buffer layer 14. The EB resist 21 is thereafter removed.

Figure 7C:
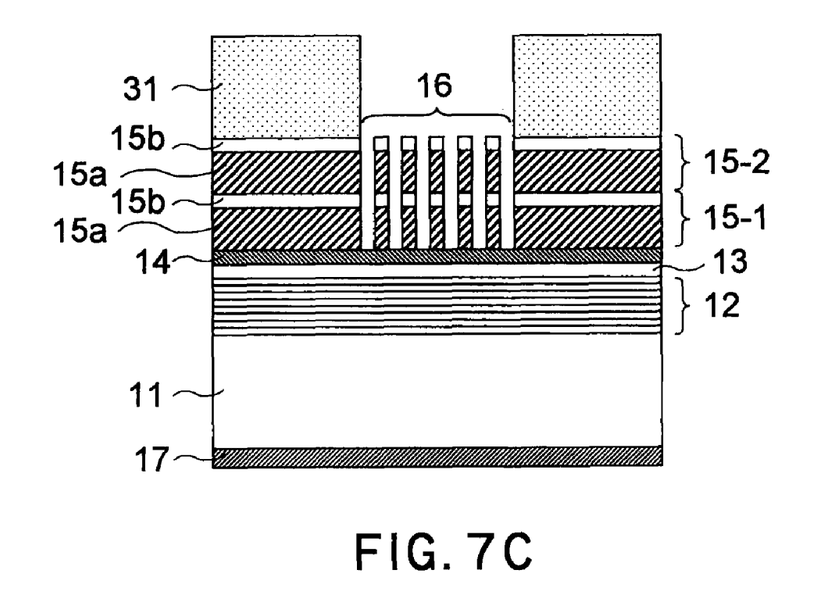
FIG. 7C is a sectional view following FIG. 7B, showing the process of making the reflection-type mask according to the third embodiment of the present invention.

(4) Next, photoresist 31 is applied on the second photoabsorber layer 15-2 and the exposed buffer layer 14, and a predetermined pattern is drawn with laser light so that the photoresist 31 on the circuit pattern region 16 is removed in a development step.

(5) Next, a resist development step is performed to expose the circuit pattern region 16, as shown in FIG. 7C.

(6) Next, the antireflection film 15b in the second photoabsorber layer 15-2 in the circuit pattern region 16 is selectively etched by using a dry etching gas. In a case where TaBO is used as the material of the antireflection film 15b, a fluoric gas (e.g., $CF_4$, $SF_6$ or $CHF_3$) is used as the dry etching gas.

Figure 7D:
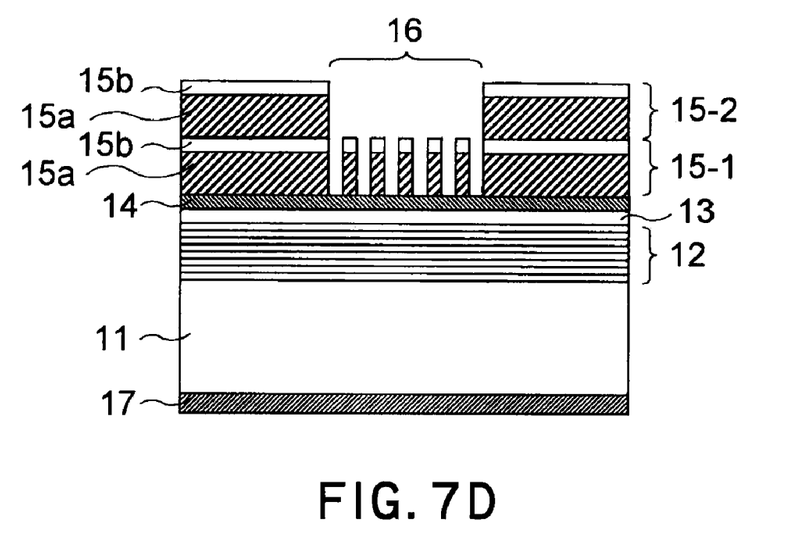
FIG. 7D is a sectional view following FIG. 7C, showing the process of making the reflection-type mask according to the third embodiment of the present invention.

(7) Next, the absorber 15a in the second photoabsorber layer 15-2 in the circuit pattern region 16 is selectively etched by using a dry etching gas. In a case where TaBN is used as the material of the absorber 15a, a chloric gas (e.g., $Cl_2$ or $BCl_3$) is used as the dry etching gas. The photoresist 31 is thereafter removed. The second photoabsorber layer 15-2 in the circuit pattern region 16 is thereby removed, as shown in FIG. 7D.

(8) Next, a defect inspection step and a correction step are performed, thereby detecting and removing defects on the pattern.

Figure 7E:
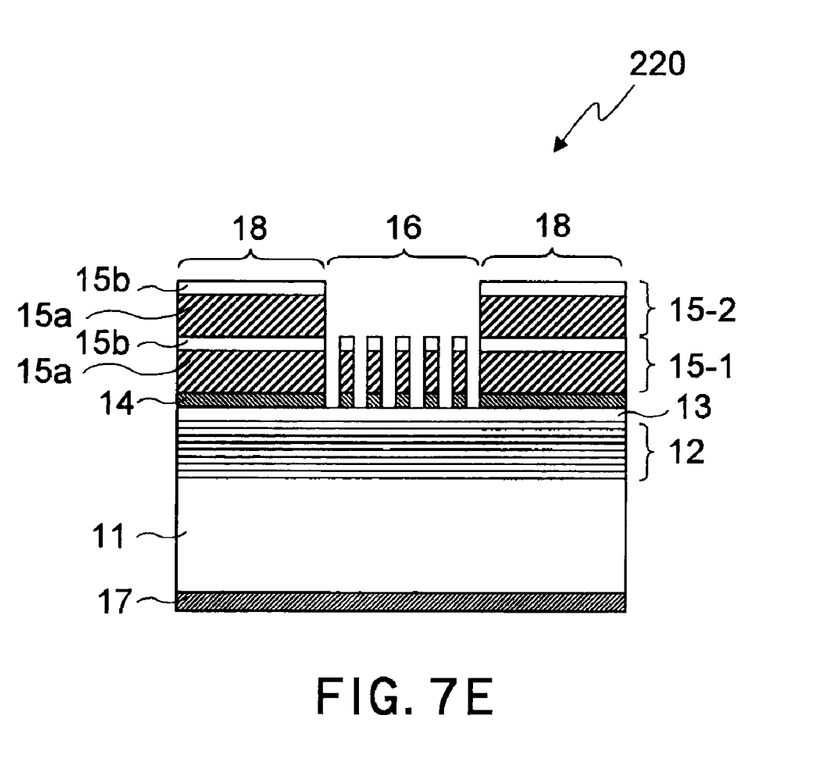
FIG. 7E is a sectional view of the reflection-type mask according to the third embodiment.

(9) Next, as shown in FIG. 7E, the buffer layer 14 positioned at openings of the circuit pattern region 16 is etched to expose portions of the capping layer 13. The circuit pattern region 16 is thereby completed.

The reflection-type mask 220 according to the present embodiment is obtained by the above-described method.

FIG. 7E shows a section of the reflection-type mask 220. As shown in FIG. 7E, the portion where the second photoabsorber 15-2 is remaining forms a shading frame 18. In the shading frame 18 portion, the thickness of the photoabsorber layer is large and, therefore, the reflectance with respect to exposure light is low. Thus, the desired shading performance of the shading frame 18 can be secured without increasing the thickness of the first photoabsorber layer 15-1.

In the present embodiment, as described above, the shading frame 18 having sufficient shading performance can be formed by providing the second photoabsorber layer 15-2 on the first photoabsorber layer 15-1 in the portion in which the shading frame is to be formed.

Also, since there is no need to increase the thickness of the first photoabsorber layer 15-1 in the circuit pattern region 16 for the purpose of securing the desired shading performance, the shadowing effect can be reduced. Further, a reflection-type mask capable of attenuated phase shift exposure can be obtained by setting the thickness of the first photoabsorber layer 15-1 to a suitable value according to the material.

Fourth Embodiment

Figure 8:
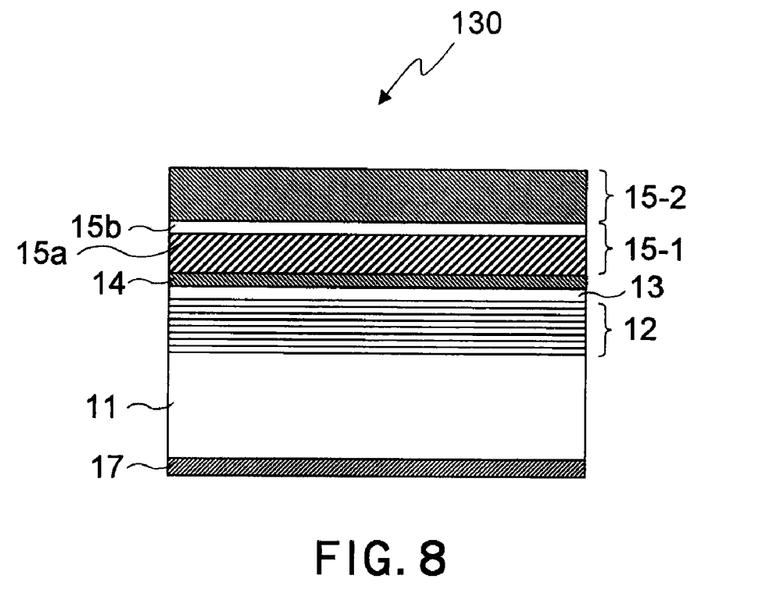
FIG. 8 is a sectional view of a mask blank used in a reflection-type mask.

The fourth embodiment of the present invention will be described. In the fourth embodiment, a mask blank 130 shown in FIG. 8 is used. This mask blank 130 differs in the material of the second photoabsorber layer 15-2 from the mask blank 120 described above in the description of the third embodiment. That is, a material containing chromium (e.g., Cr, CrN or CrOx) is used as the material of the second photoabsorber layer 15-2, thereby enabling the buffer layer 14 and the second photoabsorber layer 15-2 to be worked simultaneously with each other.

Figure 9A:
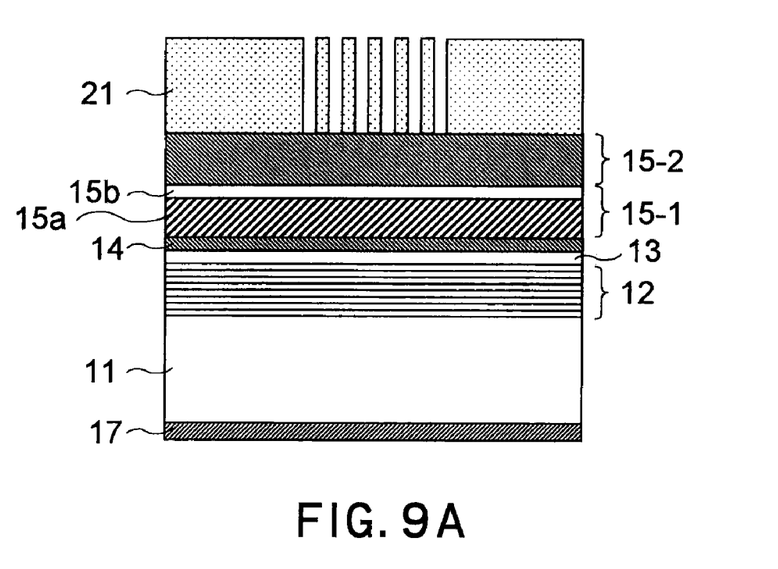
FIG. 9A is a sectional view showing a process of making a reflection-type mask according to a fourth embodiment of the present invention.

A procedure of making a reflection-type mask 230 according to the present embodiment shown in FIG. 9D from the above-described mask blank 130 will be described.

(1) First, EB resist 21 is applied on the second photoabsorber layer 15-2. A desired circuit pattern is thereafter drawn with an electron beam by using an electron beam drawing device.

(2) Next, a PEB step and a development step are performed to form a resist pattern, as shown in FIG. 9A.

Figure 9B:
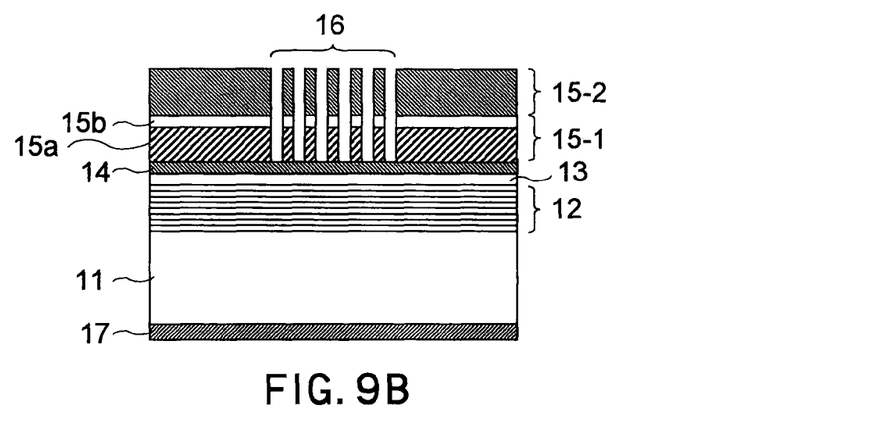
FIG. 9B is a sectional view following FIG. 9A, showing the process of making the reflection-type mask according to the fourth embodiment of the present invention.

(3) Next, as shown in FIG. 9B, the first photoabsorber layer 15-1 and the second photoabsorber layer 15-2 are etched by a plasma process to expose portions of the buffer layer 14. The EB resist 21 is thereafter removed.

(4) Next, a defect inspection step and a correction step are performed, thereby detecting and removing defects on the pattern.

Figure 9C:
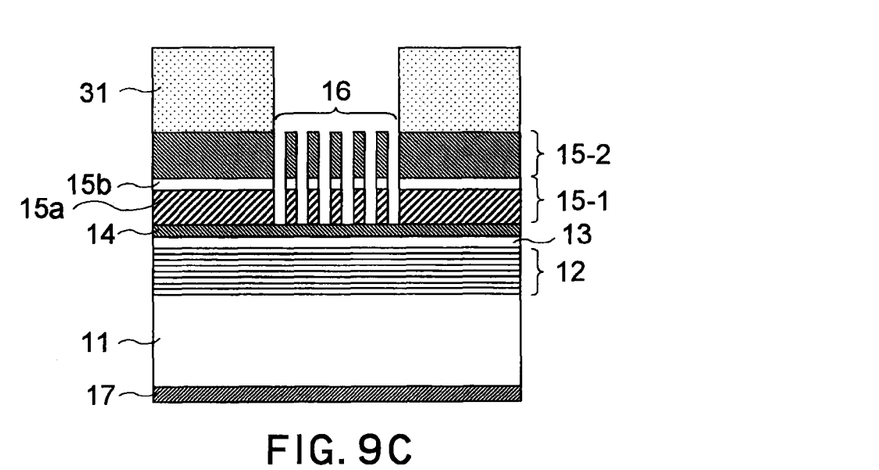
FIG. 9C is a sectional view following FIG. 9B, showing the process of making the reflection-type mask according to the fourth embodiment of the present invention.
Figure 9D:
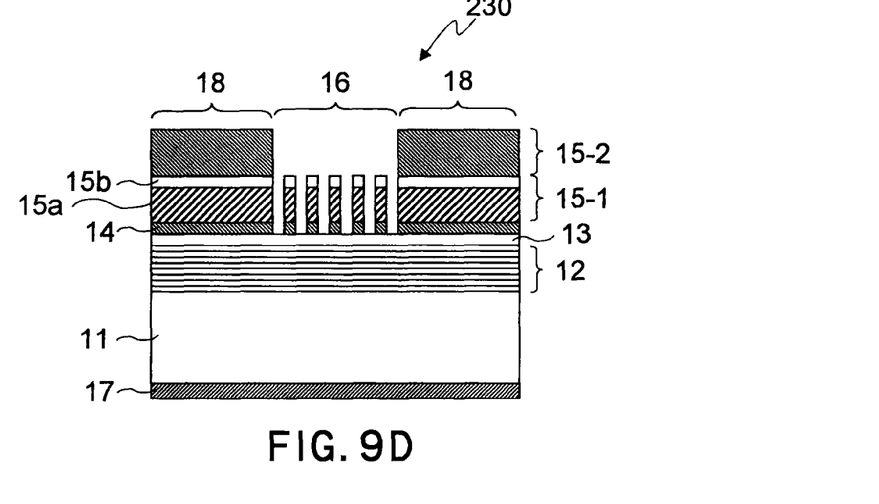
FIG. 9D is a sectional view of the reflection-type mask according to the fourth embodiment.

(5) Next, photoresist 31 is applied on the second photoabsorber layer 15-2 and the exposed buffer layer 14, and a predetermined pattern is drawn with laser light so that the photoresist 31 on the circuit pattern region 16 is removed in a development step.

(6) Next, a resist development step is performed to expose the circuit pattern region 16, as shown in FIG. 9C.

(7) Next, the second photoabsorber layer 15-2 in the circuit pattern region 16 is etched by plasma etching using a mixture gas of chlorine ($Cl_2$) and oxygen ($O_2$). By this etching, the buffer layer 14 positioned at the openings are simultaneously etched. The photoresist 31 is thereafter removed.

The reflection-type mask 230 according to the present embodiment is obtained by the above-described method. FIG. 9D shows a section of the reflection-type mask 230. As shown in FIG. 9D, the portion where the second photoabsorber layer 15-2 remains forms a shading frame 18. In the shading frame 18 portion, the thickness of the photoabsorber layer is large and, therefore, the reflectance with respect to exposure light is low. Thus, the desired shading performance of the shading frame 18 can be secured without increasing the thickness of the first photoabsorber layer 15-1.

In the present embodiment, as described above, the shading frame 18 having sufficient shading performance can be formed by providing the second photoabsorber 15-2 including chromium on the first photoabsorber 15-1 in the portion in which the shading frame is to be formed.

Also, since there is no need to increase the thickness of the first photoabsorber layer 15-1 in the circuit pattern region 16 for the purpose of securing the desired shading performance, the shadowing effect can be reduced. Further, a reflection-type mask capable of attenuated phase shift exposure can be obtained by setting the thickness of the first photoabsorber layer 15-1 to a suitable value according to the material.

Further, since the buffer layer 14 and the second photoabsorber layer 15-2 contain chromium (Cr) in common, the second photoabsorber layer 15-2 and the buffer layer 14 can be simultaneously etched, thus enabling simplification of the process of manufacturing the reflection-type mask.

Fifth Embodiment

Figure 10A:
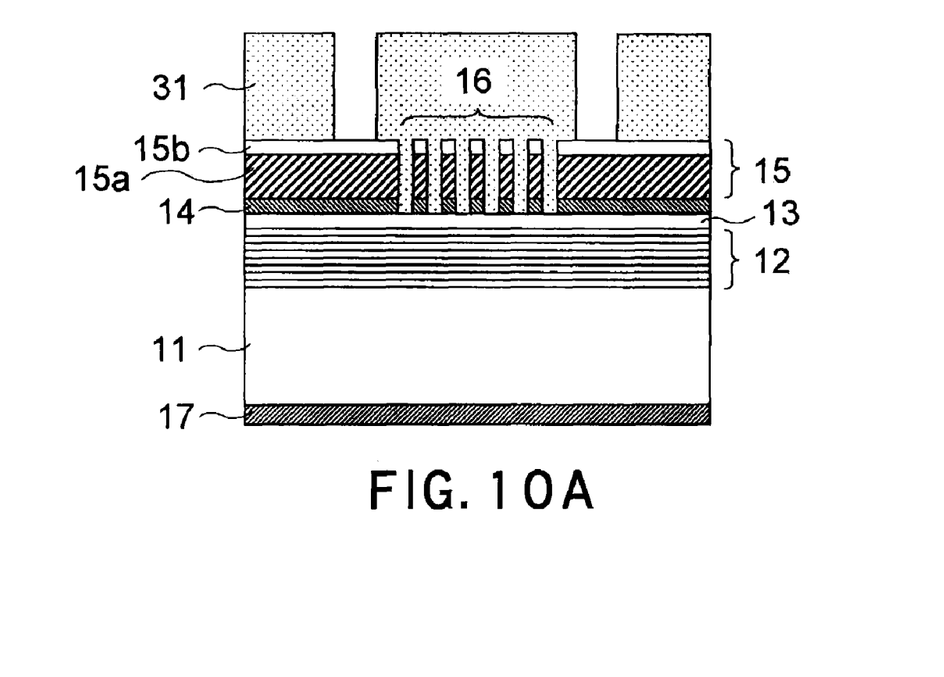
FIG. 10A is a sectional view showing a process of making a reflection-type mask according to a fifth embodiment of the present invention.
Figure 10B:
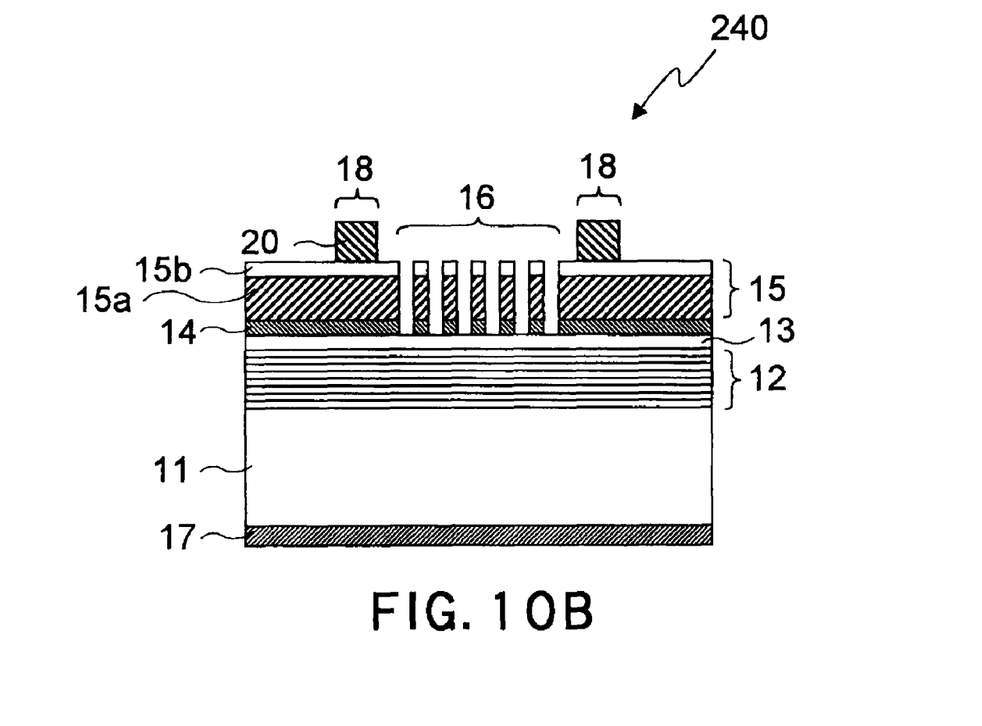
FIG. 10B is a sectional view of the reflection-type mask according to the fifth embodiment.

The fifth embodiment of the present invention will be described. In the fifth embodiment, the same mask blank 100 as that in the first embodiment is used. A reflection-type mask 240 according to the present embodiment differs from the reflection-type mask 200 according to the first embodiment in that the reflectance with respect to EUV light is reduced by forming a shading layer 20 which absorbs exposure light in a portion in which a shading frame 18 is to be formed.

A method of making the reflection-type mask 240 according to the present embodiment will be described.

(1) By the process described above in the description of the first embodiment, a reflection-type mask at an intermediate making stage shown in FIG. 2C is obtained.

(2) Next, photoresist 31 is applied on the photoabsorber layer 15 and the exposed capping layer 13. Patterning of the photoresist 31 with laser light or the like is performed. In the portion on which this patterning is performed, the shading frame is to be formed.

(3) Next, as shown in FIG. 10A, a resist development step is performed to expose the photoabsorber layer 15 in the portion in which the shading frame is to be formed.

(4) Next, film forming for the shading layer 20 is performed on the photoresist 31 and the exposed photoabsorber layer 15. Tantalum (Ta) or chromium (Cr) is used as the material of the shading layer 20.

(5) Next, the photoresist 31 is removed and the film-formed material on the resist is also removed simultaneously (lift-off). As a result, the shading layer 20 remains only in the portion in which the shading frame is to be formed.

The reflection-type mask 240 according to the present embodiment shown in FIG. 10B is obtained by the above-described method. Since the shading layer 20 absorbs exposure light, the reflectance in the shading frame 18 with respect to exposure light is low. Therefore, the desired shading performance of the shading frame 18 can be secured without increasing the thickness of the photoabsorber layer 15.

Figure 11:
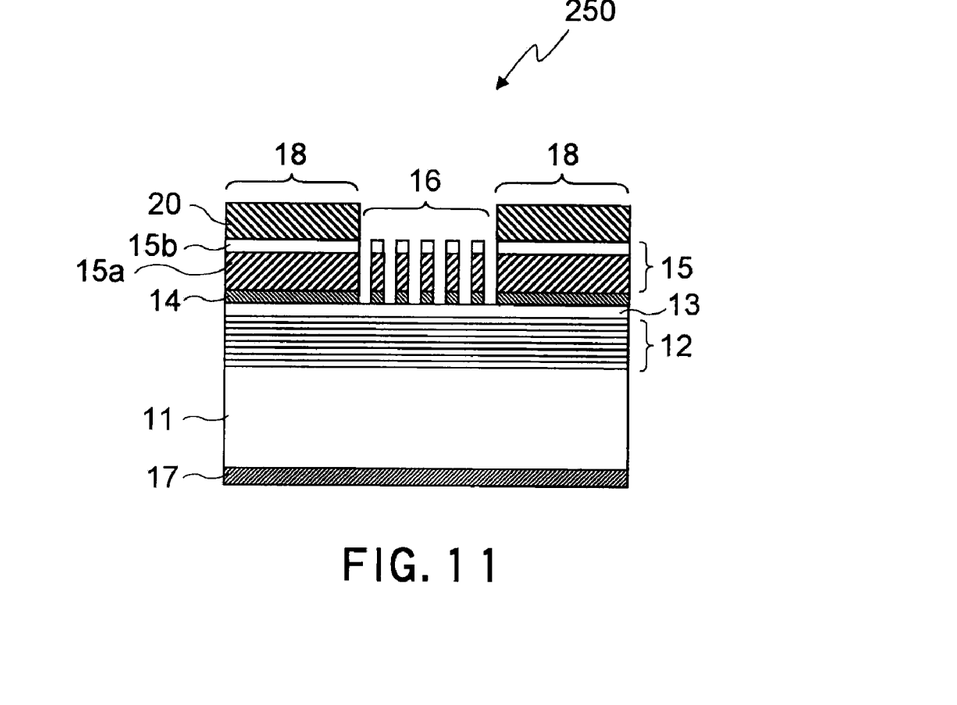
FIG. 11 is a sectional view of a reflection-type mask as a modified example of the fifth embodiment.

According to the above description, the shading layer 20 is formed only in the portion in which the shading frame is to be formed. However, the shading layer 20 may be formed on the entire peripheral portion around the circuit pattern region 16, as in a reflection-type mask 250 shown in FIG. 11. This arrangement has the advantage of enabling simplification of the process. In this case, however, the shading layer 20 is also formed on the alignment marks on the peripheral portion. It is, therefore, preferable to control the material and the film thickness of the shading layer 20 so that a sufficiently high contrast is obtained with respect to the wavelength of alignment light.

In the present embodiment, as described above, the shading frame 18 having sufficient shading performance can be formed by providing the shading layer 20 on the photoabsorber 15 in the portion in which the shading frame is to be formed.

Also, since there is no need to increase the thickness of the photoabsorber layer 15 in the circuit pattern region 16 for the purpose of securing the desired shading performance, the shadowing effect can be reduced. Further, a reflection-type mask capable of attenuated phase shift exposure can be obtained by setting the thickness of the photoabsorber layer 15 to a suitable value according to the material.

Sixth Embodiment

Figure 12:
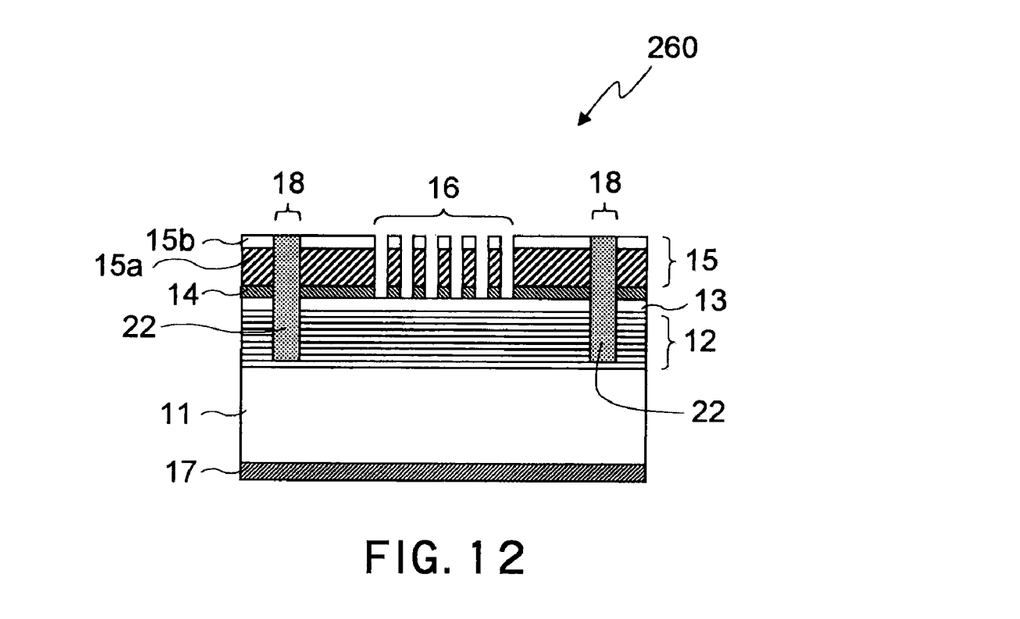
FIG. 12 is a sectional view of a reflection-type mask according to a sixth embodiment of the present invention.

The sixth embodiment of the present invention will be described. In the sixth embodiment, the same mask blank 100 as that in the first embodiment shown in FIG. 1 is used. A reflection-type mask 260 according to the present embodiment, the reflectance of the multilayer reflective film 12 with respect to EUV light is reduced by forming a denatured layer in the portion in which a shading frame is to be formed. As a method of forming this denatured layer, a method using ion implantation and a method of applying high-energy femtosecond laser pulse light are applicable.

A method using ion implantation will first be described.

(1) By the process described above in the description of the first embodiment, to the mask blank 100 a reflection-type mask at an intermediate making stage shown in FIG. 3B is obtained.

(2) Next, ions accelerated by an ion implantation device are implanted from above as viewed in the figure so that the ions reach the multilayer reflective film 12.

A denatured layer 22 is thereby formed, as shown in FIG. 12. The crystallinity of the multilayer reflective film 12 is destroyed in the denatured layer 22, the reflectance in the shading frame 18 with respect to EUV light is reduced.

(3) The photoresist 31 is removed.

A method of applying femtosecond laser pulse light will next be described.

(1) By the process described above in the description of the first embodiment, to the mask blank 100 a reflection-type mask at the intermediate making stage shown in FIG. 2C is obtained.

(2) Next, femtosecond laser pulse light is applied to the portion in which the shading frame is to be formed, thereby heating the multilayer reflective film 12.

A denatured layer 22 is thereby formed, as shown in FIG. 12. An intermediate layer formed of a compound of silicon (Si) and molybdenum (Mo) is formed at the interface between the Si thin film and the Mo thin film constituting the multilayer reflective film 12 in the denatured layer 22. As a result, the reflectance in the shading frame 18 with respect to EUV light is reduced.

In the present embodiment, as described above, the denatured layer 22 is formed by ion implantation of irradiation with femtosecond laser pulse light in the portion in which the shading frame 18 is to be formed, thus enabling forming of the shading frame 18 having sufficient shading performance.

Also, since there is no need to increase the thickness of the photoabsorber layer 15 in the circuit pattern region 16 for the purpose of securing the desired shading performance, the shadowing effect can be reduced. Further, a reflection-type mask capable of attenuated phase shift exposure can be obtained by setting the thickness of the photoabsorber layer 15 to a suitable value according to the material.

The first to sixth embodiments of the present invention have been described.

Transfer of a device pattern having a half pitch of 22 nm was performed by using the reflection-type masks made as described above to find that the shadowing effect was reduced in a circuit pattern region having a small line width as a result of the reduction in thickness of the photoabsorber layer in comparison with the conventional mask.

Also, the masks were capable of attenuated phase exposure, therefore had an increased exposure amount margin and an increased focus margin and were able to have finer pattern resolution in comparison with the conventional reflection-type mask for EUV exposure having a light absorber layer.

Also, it was confirmed that a reflectance of 0.1% or less in the shading frame with respect to incident EUV light was achieved, and that the shading frame had sufficient shading performance. As a result, a marked improvement in yield in manufacture of a semiconductor device was made possible.

While the reflectance is reduced only in the shading frame portion in the above-described embodiments, a different region with which shading is to be performed may be processed by the same process as that performed on the shading frame to achieve a sufficiently reduced reflectance.

While the mask blanks in the above-described embodiments are substrates before application of resist film, a substrate, such as shown in FIG. 2A, having a resist film applied on the photoabsorber layer 15 and subject to baking before exposure may alternatively be used as a mask blank.

Further, suitable ones of the shading frames 18 and the methods of forming the shading frames in the above-described embodiments may be combined.

Additional advantages and modifications will readily occur to those skilled in the art.

Therefore, the invention in its broader aspects is not limited to the specific details and representative embodiments shown and described herein.

Accordingly, various modifications may be made without departing from the spirit or scope of the general inventive concept as defined by the appended claims and their equivalents.

The invention claimed is:

1. A reflection-type mask comprising:
   a substrate;
   a multilayer reflective film which is formed above the substrate, and which reflects exposure light;
   a photoabsorber layer which is formed above the multilayer reflective film, and which absorbs the exposure light;
   a circuit pattern region constituted, in conformity with a predetermined circuit pattern, of an opening formed as a result of removal of the photoabsorber layer, and an absorbing portion where the photoabsorber layer remains; and
   a shading region having a trench formed as an etched portion from the surface of the photoabsorber layer at least to an intermediate position in the multilayer reflective film.

2. The reflection-type mask according to claim 1, wherein the absorbing portion of the circuit pattern region radiates, as first reflection light, a predetermined proportion of light in the exposure light applied to the absorbing portion while phase-shifting the first reflection light so that the first reflection light has a phase difference of a predetermined value from second reflection light reflected by the multilayer reflective film and radiated from the opening in the exposure light applied to the opening.

3. The reflection-type mask according to claim 2, wherein the predetermined proportion is 1 to 20% and the predetermined value is 175° to 185°.

4. The reflection-type mask according to claim 1, wherein the shading region is a shading frame provided so as to surround the circuit pattern region.

5. The reflection-type mask according to claim 1, wherein the multilayer reflective film remaining in the shading region without being etched includes an electroconductive thin film.

6. The reflection-type mask according to claim 1, further comprising an electroconductive layer between the substrate and the multilayer reflective film, wherein the shading region has a trench region formed as etched portions of the photoabsorber layer and the multilayer reflective film, the electroconductive layer being exposed at the bottom of the trench.

7. A reflection-type mask comprising:
   a substrate:
   a multilayer reflective film which is formed above the substrate, and which reflects exposure light;
   a first photoabsorber layer which is formed above the multilayer reflective film, and which absorbs the exposure light,
   a circuit pattern region constituted, in conformity with a predetermined circuit pattern, of an opening formed as a result of removal of the first photoabsorber layer, and an absorbing portion where the first photoabsorber layer remains; and
   a shading region having a second photoabsorber layer which is formed on the first photoabsorber layer, and which absorbs the exposure light.

8. The reflection-type mask according to claim 7, further comprising a buffer layer formed of chromium (Cr) between the multilayer reflective film and the first photoabsorber layer, wherein the second photoabsorber layer is constituted of a material containing chromium (Cr).

9. A reflection-type mask comprising:
   a substrate;
   a multilayer reflective film which is formed above the substrate, and which reflects exposure light;
   a photoabsorber layer which is formed above the multilayer reflective film, and which absorbs the exposure light;
   a circuit pattern region constituted, in conformity with a predetermined circuit pattern, of an opening formed as a result of removal of the photoabsorber layer, and an absorbing portion where the photoabsorber layer remains; and
   a shading region having a shading layer which is formed on the photoabsorber layer, and which is formed of tantalum (Ta) or chromium (Cr).

10. A reflection-type mask comprising:
a substrate;
a multilayer reflective film which is formed above the substrate, and which reflects exposure light;
a photoabsorber layer which is formed above the multilayer reflective film, and which absorbs the exposure light;
a circuit pattern region constituted, in conformity with a predetermined circuit pattern, of an opening formed as a result of removal of the photoabsorber layer, and an absorbing portion where the photoabsorber layer remains; and
a shading region having a denatured layer in which the multilayer reflective film is implanted with ions, and in which the crystallinity is destroyed.

11. A reflection-type mask comprising:
a substrate;
a multilayer reflective film which is formed above the substrate, and which reflects exposure light;
a photoabsorber layer which is formed above the multilayer reflective film, and which absorbs the exposure light;
a circuit pattern region constituted, in conformity with a predetermined circuit pattern, of an opening formed as a result of removal of the photoabsorber layer, and an absorbing portion where the photoabsorber layer remains; and
a shading region having a denatured layer in which an intermediate layer is formed at the interface between thin films constituting the multilayer reflective film.

12. A method of manufacturing a reflection-type mask, comprising:
preparing a substrate;
forming a multilayer reflective film above the substrate;
forming a photoabsorber layer above the multilayer reflective film;
forming a circuit pattern region constituted of an opening formed as a result of removal of the photoabsorber layer, and an absorbing portion where the photoabsorber layer remains, by etching the photoabsorber layer in conformity with a predetermined circuit pattern; and
forming a shading region by etching the photoabsorber layer and at least part of the multilayer reflective film.

13. A method of manufacturing a reflection-type mask, comprising:
preparing a substrate;
forming a multilayer reflective film above the substrate;
forming a photoabsorber layer above the multilayer reflective film;
forming a circuit pattern region constituted of an opening formed as a result of removal of the photoabsorber layer, and an absorbing portion where the photoabsorber layer remains, by etching the photoabsorber layer in conformity with a predetermined circuit pattern; and
forming a shading region having a reflectance with respect to the exposure light lower than that in the absorbing portion of the circuit pattern region,
wherein an electroconductive layer is formed on the substrate after the preparation of the substrate; the multilayer reflective film is thereafter formed on the electroconductive layer; and the shading region is formed by etching the photoabsorber layer and the multilayer reflective film until the electroconductive layer is exposed.

14. A method of manufacturing a reflection-type mask, comprising:
preparing a substrate;
forming a multilayer reflective film above the substrate;
forming a first photoabsorber layer above the multilayer reflective film;
forming a second photoabsorber layer on the first photoabsorber layer after forming the first photoabsorber layer;
forming a circuit pattern region constituted of an opening formed as a result of removal of the first photoabsorber layer, and an absorbing portion where the first photoabsorber layer remains, by etching the first photoabsorber layer in conformity with a predetermined circuit pattern; and
forming a shading region having a reflectance with respect to the exposure light lower than that in the absorbing portion of the circuit pattern region,
wherein the circuit pattern region is formed by etching the first photoabsorber layer and the second photoabsorber layer in conformity with the predetermined circuit pattern, and thereafter removing the second photoabsorber layer on the first photoabsorber layer in the circuit pattern region.

15. The method according to claim 14, further comprising forming a buffer layer formed of chromium (Cr) above the multilayer reflective film after forming the multilayer reflective film, wherein the first photoabsorber layer is formed on the buffer layer and the second photoabsorber layer is formed of a material containing chromium, and wherein when the circuit pattern region is formed, the second photoabsorber layer and the buffer layer exposed in the opening are simultaneously etched.

16. A method of manufacturing a reflection-type mask, comprising:
preparing a substrate;
forming a multilayer reflective film above the substrate;
forming a photoabsorber layer above the multilayer reflective film;
forming a circuit pattern region constituted of an opening formed as a result of removal of the photoabsorber layer, and an absorbing portion where the photoabsorber layer remains, by etching the photoabsorber layer in conformity with a predetermined circuit pattern,
applying a photoresist on the first photoabsorber layer and the multilayer reflective film exposed in the opening after forming the circuit pattern region;
performing patterning on the photoresist so that the photoabsorber layer in the portion in which a shading region is to be formed is exposed;
forming a film for the shading layer on the photoresist and the photoabsorber layer exposed; and
removing the photoresist while leaving the shading layer on the photoabsorber layer in the portion in which the shading region is to be formed.

17. A method of manufacturing a reflection-type mask, comprising:
preparing a substrate;
forming a multilayer reflective film above the substrate;
forming a photoabsorber layer above the multilayer reflective film;
forming a circuit pattern region constituted of an opening formed as a result of removal of the photoabsorber layer, and an absorbing portion where the photoabsorber layer remains, by etching the photoabsorber layer in conformity with a predetermined circuit pattern; and forming a shading region having a reflectance with respect to the exposure light lower than that in the absorbing portion of the circuit pattern region, wherein the shading region is formed by destroying the crystallinity of the multilayer reflective film by implanting ions so that the ions reach the multilayer reflective film from the surface of the photoabsorber layer.

18. A method of manufacturing a reflection-type mask, comprising:

preparing a substrate;

forming a multilayer reflective film above the substrate;

forming a photoabsorber layer above the multilayer reflective film;

forming a circuit pattern region constituted of an opening formed as a result of removal of the photoabsorber layer, and an absorbing portion where the photoabsorber layer remains, by etching the photoabsorber layer in conformity with a predetermined circuit pattern; and forming a shading region having a reflectance with respect to the exposure light lower than that in the absorbing portion of the circuit pattern region, wherein the multilayer reflective film is formed by stacking a pair of thin films constituted of a silicon thin film and a molybdenum thin film, and the shading region is formed by irradiating the multilayer reflective film with laser so that an intermediate layer formed of a compound of silicon and molybdenum is formed at the interface between the silicon thin film and the molybdenum thin film.

* * * * *